United States Patent [19]

Estrada et al.

[11] Patent Number: 4,718,548

[45] Date of Patent: Jan. 12, 1988

[54] PROTECTIVE HOUSING FOR A LEADLESS CHIP CARRIER OR PLASTIC LEADED CHIP CARRIER PACKAGE

[75] Inventors: David Estrada, Santa Clara; Danh C. Tran, San Jose; Alex A. Zambo, Sunnyvale, all of Calif.

[73] Assignee: Advanced Micro Devices, Inc., Sunnyvale, Calif.

[21] Appl. No.: 944,266

[22] Filed: Dec. 19, 1986

[51] Int. Cl.⁴ ............................................. B65D 85/30
[52] U.S. Cl. ................................. 206/329; 206/328; 206/334; 439/72
[58] Field of Search ................................. 174/138 G; 206/328–334, 454–456, 560; 339/17 CF, 19; 439/71, 72

[56] References Cited

U.S. PATENT DOCUMENTS

| | | | |
|---|---|---|---|
| 3,604,557 | 9/1971 | Cedrone | 206/329 |
| 4,379,505 | 4/1983 | Alemanni | 206/331 |
| 4,444,309 | 4/1984 | Morton, Jr. | 206/329 |
| 4,556,145 | 12/1985 | Putnam | 206/331 |
| 4,591,053 | 5/1986 | Alemanni | 206/334 |

*Primary Examiner*—Jimmy G. Foster
*Attorney, Agent, or Firm*—Patrick T. King; Davis Chin

[57] ABSTRACT

A protective housing for a leadless chip carrier or plastic leaded chip carrier package includes a substantially rectangular-shaped solid body having a central cavity for receiving a chip package. The solid body is formed of four side portions. Beam members are pivotally connected on opposite sides of two of the four side portions of the solid body for retaining the package within the central cavity. A plurality of support members are formed on the interior surface of the two opposite side portions and the beam members for supporting the lower surface of the package at each of its four corners. The solid body is provided with two opposite chamfered corners for moving outwardly the beam members away from the central cavity so as to permit insertion or removal of the chip package from the central cavity.

5 Claims, 7 Drawing Figures

PROTECTIVE HOUSING FOR A LEADLESS CHIP CARRIER OR PLASTIC LEADED CHIP CARRIER PACKAGE

DESCRIPTION

BACKGROUND OF THE INVENTION

This invention relates generally to integrated circuit chip carriers and more particularly, it relates to a protective housing for a leadless chip carrier (LCC) or plastic leaded chip carrier (PLCC) package which is used to protect the package from damage or possible destruction during testing and shipping.

While integrated circuits are conventionally housed in flat packs or dual in-line package (DIP) structures, such DIP structures become unsuitable as high density packaging of circuit functions formed on a single circuit chip increases. As a response to this demand for high density packaging for integrated circuits, there has been developed in the industry leadless chip carrier (LCC) packages and plastic leaded chip carrier (PLCC) packages. Typically, these LCC or PLCC packages are of a rectangular shape in which the dimensions of the four edges are varying in width and length. This is due to the fact that the package size is dependent upon the number of bond pads (for the LCC) or terminal leads (for the PLCC) which may vary from 18 to 52.

Thus, there has been encountered the problem of extra labor costs involved in adjusting of the rails in a test handler so as to accommodate the various chip package sizes when it is desired to make a test on them. Further, a number of these chip packages are generally placed laterally into a tube adjacent each other without separation during shipment. As a result, the chip packages are susceptible to being damaged during such handling and subsequent shipment.

It is therefore believed what is needed is a more or less universal housing for protecting a LCC or PLCC package from damage or possible destruction which will accommodate a wide range of carrier package sizes. It would also be expedient to provide a housing which can be formed as a molded single-piece structure that can be easily operated without the need of special equipment for inserting and removing of the chip packages from the housing. The housing for protecting a chip package of the present invention has been designed with all of these features which have been traditionally unavailable.

SUMMARY OF THE INVENTION

Accordingly, it is a general object of the present invention to provide a protective housing of a design which can be easily adapted to handle a wide range of LCC or PLCC packages with varying dimensions.

It is an object of the present invention to provide a protective housing for a leadless chip carrier or plastic leaded chip carrier package which is used to protect the package from damage or possible destruction during testing and shipping.

It is another object of the present invention to provide a protective housing for a leadless chip carrier or plastic leaded chip carrier package which can be formed as a molded single-piece structure that can be easily operated without the need of special equipment for inserting and removing of the chip package from the housing.

It is still another object of the present invention to provide a protective housing for a leadless chip carrier or plastic leaded chip carrier package which is molded from a material which is capable of operating over a wide temperature range.

In accordance with these aims and objectives, the present invention is concerned with the provision of a protective housing for a leadless chip carrier or plastic leaded chip carrier package which includes a substantially rectangular-shaped solid body having a central cavity for receiving a leadless chip carrier or a plastic leaded chip carrier package. The solid body is formed of four side portions. Beam members are pivotally connected on opposite sides of two of the four side portions of the body for retaining the package within the central cavity. Support members are formed on the two opposite side portions and on the beam members for supporting the bottom surface of the package at each of its four corners. The body is provided with actuating means for moving outwardly the beam members away from the central cavity so as to permit insertion and removal of the package from the central cavity.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
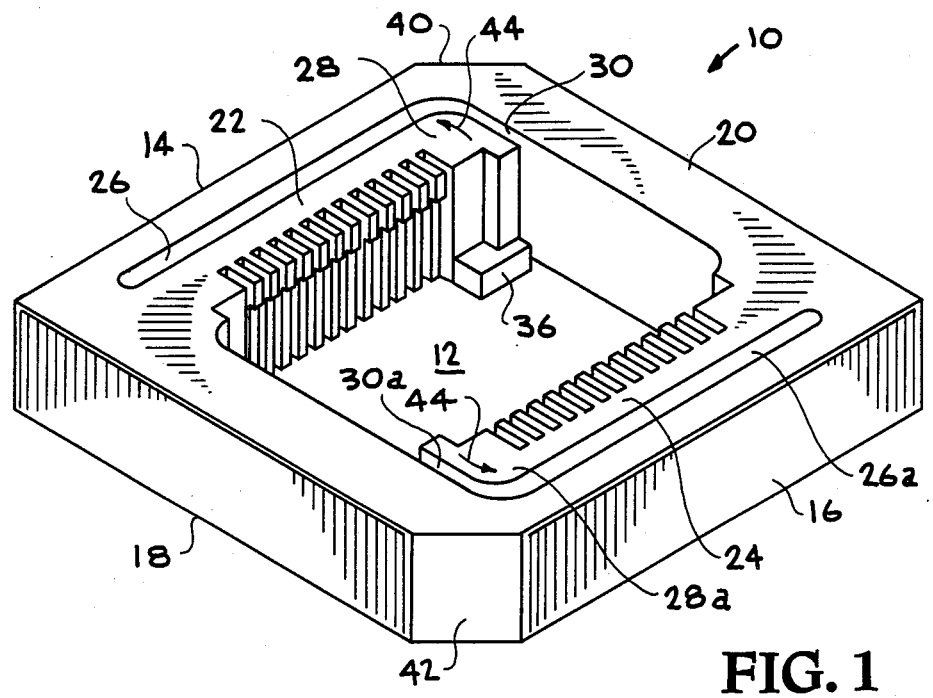
FIG. 1 is a perspective view of a protective housing constructed in accordance with the principles of the present invention.

Referring now in detail to the various views of the drawings, there is shown in FIG. 1 a perspective view of a protective housing 10 of the present invention which is used to protect either a leadless chip carrier (LCC) or a plastic leaded chip carrier (PLCC) package from damage or possible destruction during handling and shipping. The protective housing 10 is designed to be of a substantially rectangular-shaped solid body with a cavity 12 formed in its central portion to receive a chip package. The housing 10 is preferably of a square-shaped configuration and has four side portions consisting of a top side portion 14, a bottom side portion 16, a left side portion 18 and a right side portion 20. The dimension of each of the side portions 14, 16, 18 and 20 is approximately 1.200 inches in length and is approximately 0.200 inches in height. The housing is thus basically a 1.200 inch solid square structure having the central portion 12. The housing includes an upper beam or insert member 22 and a lower beam or insert member 24 which are used to retain or captivate the chip package within the central cavity as will be explained more fully in detail hereinafter.

Each of the left and right side portions 18 and 20 has a width of about 0.15 inches, and each of the top and bottom portions 14 and 16 has width of about 0.095 inches. The upper beam member 22 extends between the two side portions 18, 20 and is spaced apart a predetermined distance below the interior surface of the top portion 14 by a gap 26. The outermost surface of the upper beam member 22 is substantially parallel to the interior surface of the top portion 14. One end of the beam member 22 is formed integrally with the interior surface of the left side portion 18. The beam member 22 extends laterally towards the right side portion 20 and terminates at a free end thereof. A downwardly extending arcuate section 28 is formed integrally with the free end of the beam member 22 and is spaced apart from the interior surface of the right side portion 20 by a gap 30. It will be noted that the gaps 26 and 30 allow for the pivotal outward movement of the arcuate section 28 at the free end of the beam member 22.

Figure 4:
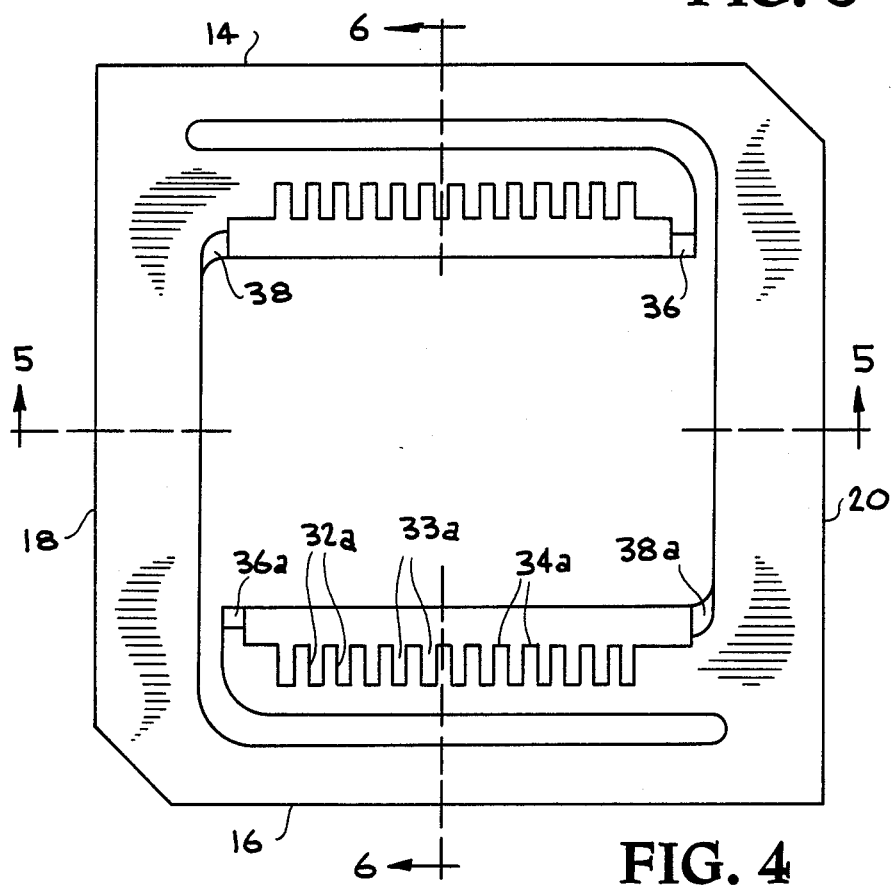
FIG. 4 is a top plan view of a protective housing constructed in accordance with the principles of the present invention.
Figure 5:
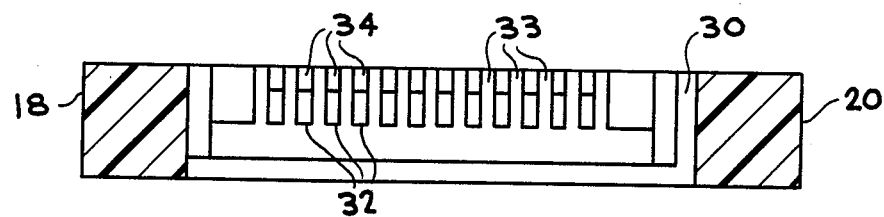
FIG. 5 is a longitudinal cross-sectional view taken along the lines 5—5 of the housing of FIG. 4.
Figure 6:
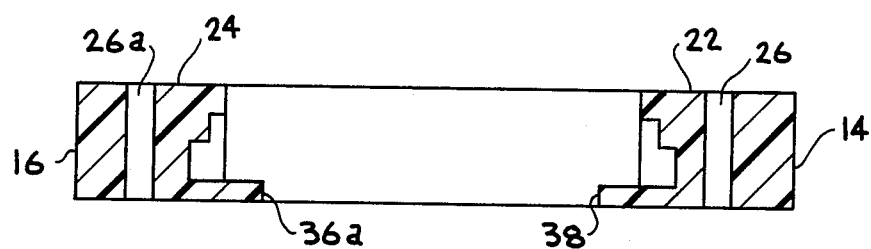
FIG. 6 is an end cross-sectional view taken along the lines 6—6 of the housing of FIG. 4.
Figure 7:
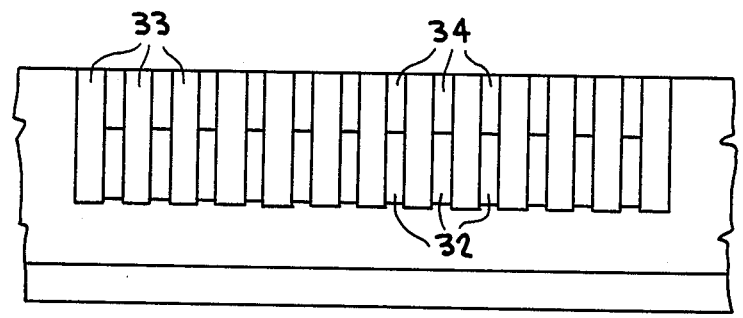
FIG. 7 is an enlarged view of the circled portion shown in FIG. 5.

As can be seen from FIGS. 4–7, the upper beam member 22 has formed along its interior surface a plurality of ribs 32 which are disposed in an equally spaced apart relationship so as to form vertical slots 33 therebetween extending upwardly from the bottom surface of the beam member 22 to the top surface thereof. The housing 10 as shown in FIG. 4 is used to retain or captivate a LCC package having 52 bond pads or a PLCC package having 52 terminal leads. Therefore, these chip carrier packages will have 13 bond pads or terminal leads on each of the four edges thereof. Accordingly, the beam member 22 is required to have twelve ribs 32 in order to form the thirteen slots 33 for receiving separately therein the corresponding bond pads or terminal leads of the chip carrier package. Each of the plurality of ribs 32 include a finger 34 extending inwardly from the top end thereof. Each of the fingers 34 are aligned with a space between corresponding adjacent pads or leads along the top edge on the chip carrier package, thereby providing separation between each of the pads or leads when the package is installed within the housing.

Similarly, the lower beam member 24 extends between the two side portions 18, 20 and is spaced apart a predetermined distance above the interior surface of the bottom portion 16 by a gap 26a. The outermost surface of the lower beam member 24 is substantially parallel to the interior surface of the bottom portion 16. One end of the lower beam member 24 is formed integrally with the interior surface of the right side portion 20. The lower beam member 24 extends laterally towards the left side portion 18 and terminates at a free end thereof. An upwardly extending arcuate section 28a is formed integrally with the free end of the lower beam member 24 and is spaced apart from the interior surface of the left side portion 18 by a gap 30a. The gaps 26a and 30a function to allow pivotal outward movement of the arcuate section 28a at the free end of the beam member 24.

The lower beam member 24 also has formed along its interior surface a plurality of ribs 32a which are disposed in an equally spaced apart relationship so as to form vertical slots 33a therebetween extending upwardly from the bottom surface of the beam member 24 to the top surface thereof. The ribs and slots formed on the lower beam member are equal in number to the ones formed on the upper beam member 22 and are in corresponding alignment with the same. Further, each of the plurality of ribs 32a includes a finger 34a extending inwardly from the top thereof. Each of the fingers 34a are aligned with a space between corresponding adjacent pads or leads along the bottom edge of the chip carrier package.

Support means are provided for supporting the bottom surface of the chip package at each of its four corners when the chip package is installed into the housing 10. The support means includes a platform or support member 36 which is formed integrally along the bottom surface of the downwardly extending arcuate section 28 and extends inwardly toward the center of the housing. A platform or support member 38 is formed integrally on the interior surface of the left side portion 18 along the bottom surface thereof. The support member 38 extends inwardly towards the center of the housing and is aligned with the support member 36. The support means further includes a platform or support member 36a which is formed integrally along the bottom surface of the upwardly extending arcuate section 28a and extends inwardly toward the center of the housing. A platform or support member 38a is formed integrally on the interior surface of the right side portion 20 along the bottom surface thereof. The bottom surfaces of the support members 36, 38, 38a and 38a all lie in the same horzontal plane as the bottom surfaces of the four side portions.

It will be understood that the height of each of the support members 36, 38, 36a and 38a are the same and are designed so as to support the chip package just below the horizontal plane containing the top surfaces of the four side portions. In this manner, a number of housings each carrying a chip package can be stacked on top of each other without causing damage or destruction to the chip package. Since the height of the LCC package is somewhat less than the height of the PLCC package, the height of the support members in the housing are generally made to be higher when used to carry the LCC package than the PLCC package.

In order to permit easy insertion of the LCC or PLCC package into the housing without the need of special tools or equipment, the outside corner opposite the arcuate section 28 and formed by the intersection of the vertical planes of the top portion 14 and the right side portion 20 is cut at approximately a 45 degree angle so as to form a chamfered surface 40, and the outside corner opposite the arcuate section 28a formed by the intersection of the vertical planes of the bottom portion 16 and left side portion 18 is cut at approximately a 45 degree angle to form a chamfered surface 42. The chamfered surfaces 40 and 42 define actuating means for moving outwardly the arcuate sections 28 and 28a away from the central cavity 12.

The chip carrier package is simply inserted within the central cavity 12 of the housing by applying pressure to squeeze the corners with the chamfered surfaces toward each other with an index finger and a thumb. As a result, the arcuate sections are caused to pivot outwardly in the direction of the arrows 44 into the respective areas formed by the gaps 26, 30 and the gaps 26a, 30a. Since the central cavity 12 is slightly larger than the chip carrier package when the arcuate sections are pivoted outwardly, the chip carrier package may be dropped into the central cavity so that the lower surface at each corner thereof will rest upon the top surface of the respective support members 36, 38, 36a and 38a. When the pressure on the opposite corners are released for retaining or captivating the chip package, the vertical slots in the upper and lower beam members 22 and 24 are automatically aligned with and receive the pad or terminal leads in the carrier package. Each of the ribs 32 with fingers 34 will come to rest in the corresponding spaces between the adjacent pads or leads so as to separate the same and thus prevent damage thereto.

Figure 2:
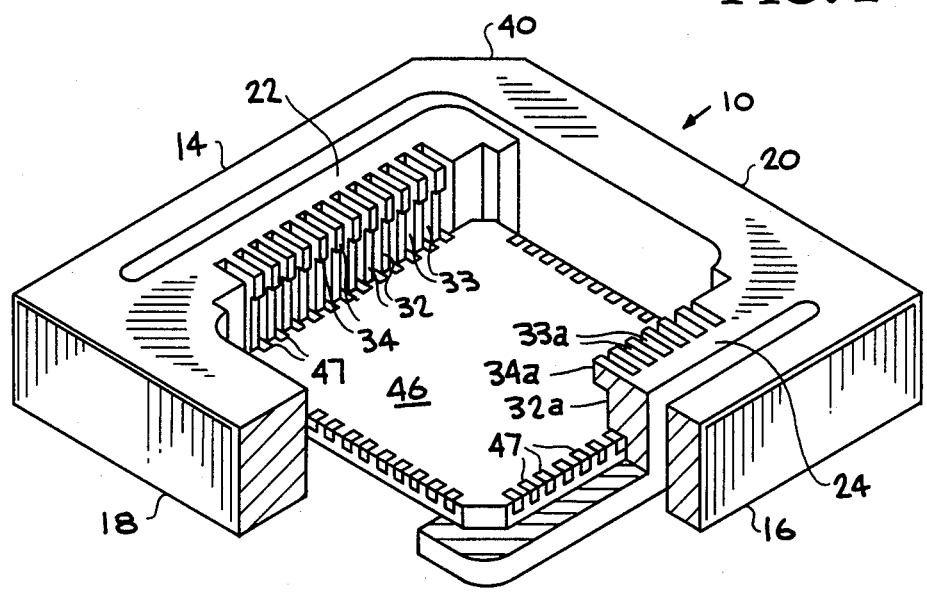
FIG. 2 is a perspective view, partly in section, of a protective housing with a LCC package in place.
Figure 3:
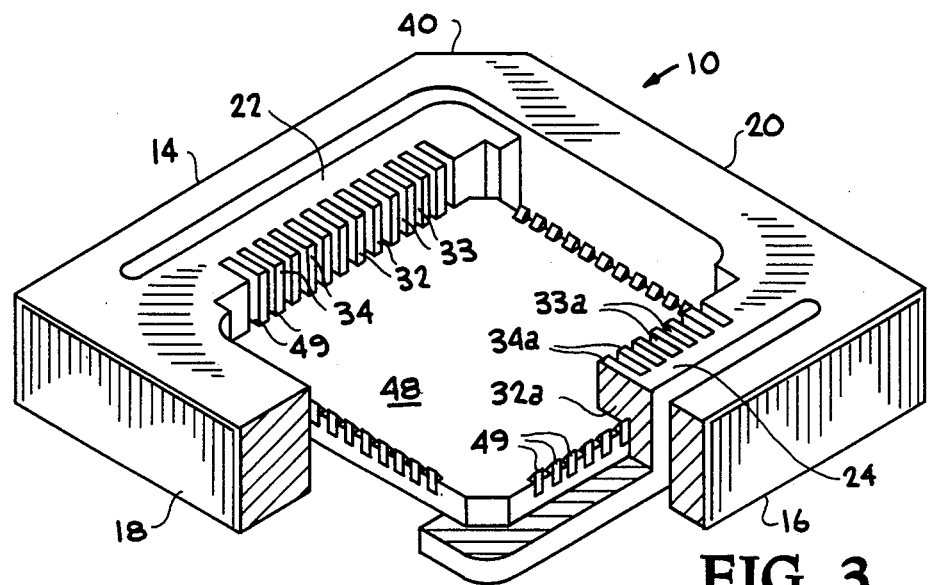
FIG. 3 is a perspective view, partly in section, of a protective housing with a PLCC package in place.

A LCC package 46 after it has been inserted into the housing 10 of the present invention is shown in FIG. 2 of the drawings. As can be seen, each of the pads 47 along the top edge of the chip package 46 are received in the slots 33 and each of the bond pads 47 along the bottom edge of the chip package is received in the vertical slots 33a. In addition, each of the ribs 32 or 32a with corresponding fingers 34 or 34a are aligned with the spaces between corresponding adjacent bond pads 47 along the top and bottom edges of the chip package. A PLCC package 48 after it has been inserted into the housing 10 of the present invention is shown in FIG. 3 of the drawings. As can be seen, each of the leads 49 along the top edge of the chip package are received in the vertical slots 33 and each of the leads 49 along the bottom edge of the chip package are received in the vertical slots 33a. Each of the plurality of ribs 32 or 32a with corresponding fingers 34 or 34a are aligned with spaces between corresponding adjacent terminal leads along the top and bottom edge of the chip package.

The removal of the chip carrier package 46 or 48 from the housing 10 may be accomplished with a similar ease of operation. By applying pressure to squeeze the chamfered corners toward each other again, the arcuate sections 28 and 28a will pivot outwardly to open up the upper and lower beams 22 and 24. Then, the chip package may be withdrawn from the housing by pushing with an upward motion with a finger on the bottom surface of the chip package.

It should be noted that the protective housing of the present invention described is an extremely simple structure which may be readily fabricated from a number of commercially available materials. For example, the housing may be made of a single-piece of molded plastic or the like. In particular, the housing is preferably molded out of a flexible filled polysulfone material. In order to design the housing to withstand operating temperatures in the range of −65° C. to 200° C., the housing could be molded from a material such as glass reinforced polyphenylene sulfide. While the housing of the present invention has been described for use in connection with a LCC package having 52 bond pads or a PLCC package having 52 terminal leads, it should be apparent that the dimensions of beam members 22 and 24 may be simply altered in order to accommodate a chip package having 18, 20, 28, 32 or 44 bond pads or terminal leads. Specifically, the number of ribs formed on the interior surface of the beam members would be reduced, the size of the gaps would be increased, and the support members would be changed so as to locate centrally the particular chip package within the cavity. Thsu, the housing of the present invention is somewhat universal in that the outer outline dimension of 1.200 inches is not required to be changed.

From the foregoing detailed description, it can thus be seen that the present invention provides a protective housing for a leadless chip carrier or plastic leaded chip carrier package which can be easily adapted to handle a wide range of chip packages with varying dimensions. Further, the protective housing of the present invention is easily operated for loading and unloading of the chip package into and out of the housing by finger pressure thereby avoiding the expense of special tools or equipment.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling without the scope of the appended claims.

What is claimed is:

1. A universal protective housing for a leadless chip carrier (LCC) or plastic leaded chip carrier (PLCC) package comprising:

a square-shaped solid body having a central cavity for receiving a LCC or PLCC package, said solid body being formed of a top side portion, a bottom side portion, a left side portion and a right side portion, each of said portions having a dimension of approximately 1.200 inches in length and approximately 0.200 inches in height;

an upper beam member extending between said left side portion and said right side portion and being spaced apart a predetermined distance below the interior surface of said top portion by a first gap, said upper beam member having its one end thereof being formed integrally with the interior surface of said left side portion, said upper beam member extending laterally toward said right side portion and terminating at a free end thereof, a downwardly extending arcuate section being formed integrally at the free end of said upper beam member and being spaced apart from the interior surface of said right side portion by a second gap;

said upper beam member including a plurality of ribs disposed along its interior surface in an equally spaced apart relationship so as to form vertical slots therebetween extending upwardly from the bottom surface of said upper beam member to the top surface thereof;

a lower beam member extending between said left side portion and said right side portion and being spaced apart a predetermined distance above the interior surface of said bottom portion by a third gap, said lower beam member having its one end thereof being formed integrally with the interior surface of said right side portion, said lower beam member extending laterally toward said left side portion and terminating at a free end thereof, an upwardly extending arcuate section being formed integrally at the free end of said lower beam member and being spaced apart from the interior surface of said left side portion by a fourth gap;

said lower beam member including a plurality of ribs disposed along its interior surface in an equally spaced apart relationship so as to form vertical slots therebetween extending upwardly from the bottom surface of said lower beam member to the top surface thereof;

each of said plurality of ribs of said upper and lower beam members including a finger extending inwardly from the top portion thereof;

a first corner formed by the intersection of said top portion and said right side portion, said first corner being cut to form a first chamfered surface;

a second corner formed by the intersection of said bottom portion and said left side portion, said second corner being cut to form a second chamfered surface;

support means for supporting the lower surface of the chip package at the corners thereof, said support means being formed on the interior surfaces of said left and right side portions and on said downwardly extending and upwardly extending arcuate sections;

said support means including a first support member formed integrally along the bottom surface of said downwardly extending arcuate section and extending inwardly toward the center of said housing, a second support member formed integrally on the interior surface of said left side portion along the bottom surface thereof and extending inwardly toward the center of said housing and being aligned with said first support member, a third support member being formed integrally along the bottom surface of said upwardly extending arcuate section and extending inwardly toward the center of said housing, and a fourth support member formed integrally on the interior surface of said right side portion along the bottom surface thereof and extending inwardly toward the center of said housing and being aligned with said third support member; and said downwardly extending and upwardly extending arcuate sections being moved outwardly from the central cavity into the respective first through fourth gaps when said first and second chamfered surfaces are squeezed toward each other so as to permit insertion or removal of the chip package from the central cavity.

2. A protective housing as claimed in claim 1, wherein said housing is formed of a single-piece molded configuration.

3. A protective housing as claimed in claim 2, wherein said housing is molded from a glass reinforced polyphenylene sulfide.

4. A protective housing as claimed in claim 2, wherein said housing is molded from a polysulfone material.

5. A protective housing as claimed in claim 1, wherein said first and second corners are cut at approximately a 45 degree angle.

* * * * *